(12) United States Patent
Hirler et al.

(10) Patent No.: US 8,263,483 B2
(45) Date of Patent: Sep. 11, 2012

(54) METHOD INCLUDING PRODUCING A MONOCRYSTALLINE LAYER

(75) Inventors: Franz Hirler, Isen (DE); Hans-Joachim Schulze, Taufkirchen (DE)

(73) Assignee: Infineon Technologies Austria AG, Villach (AT)

( * ) Notice: Subject to any disclaimer, the term of this patent is extended or adjusted under 35 U.S.C. 154(b) by 509 days.

(21) Appl. No.: 12/498,418

(22) Filed: Jul. 7, 2009

(65) Prior Publication Data

US 2010/0009525 A1    Jan. 14, 2010

(51) Int. Cl.
*H01L 21/20* (2006.01)

(52) U.S. Cl. ........ 438/499; 438/506; 438/528; 438/530; 438/795; 117/8; 117/9; 117/58; 117/95; 117/106; 257/E21.09

(58) Field of Classification Search .................. 438/492, 438/530; 257/E21.12; 117/8, 9, 58, 95, 106
See application file for complete search history.

(56) References Cited

U.S. PATENT DOCUMENTS

| | | | |
|---|---|---|---|
| 7,202,145 | B2 | 4/2007 | Cao |
| 2003/0013280 | A1 | 1/2003 | Yamanaka |
| 2007/0090487 | A1* | 4/2007 | Babich et al. ................. 257/592 |

* cited by examiner

*Primary Examiner* — Mary Wilczewski
*Assistant Examiner* — Toniae Thomas
(74) *Attorney, Agent, or Firm* — Dicke, Billig & Czaja, PLLC

(57) ABSTRACT

A method including producing a monocrystalline layer is disclosed. A first lattice constant on a monocrystalline substrate has a second lattice constant at least in a near-surface region. The second lattice constant is different from the first lattice constant. Lattice matching atoms are implanted into the near-surface region. The near-surface region is momentarily melted. A layer is epitaxially deposited on the near-surface region that has solidified in monocrystalline fashion.

25 Claims, 4 Drawing Sheets

METHOD INCLUDING PRODUCING A MONOCRYSTALLINE LAYER

CROSS-REFERENCE TO RELATED APPLICATIONS

This Utility Patent Application claims priority to German Patent Application No. DE 10 2008 032 171.0 filed on Jul. 8, 2008, which is incorporated herein by reference.

BACKGROUND

The invention relates to a method for producing a monocrystalline layer on a substrate. In one embodiment, the invention relates to a method for producing a semiconductor including a monocrystalline layer on a substrate.

Monocrystalline layers can be produced by epitaxial deposition on a monocrystalline substrate. In this case, different lattice constants of the layer and of the substrate can lead to defects in the crystal lattice of the layer. For these and other reasons, there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

Figure 1A:
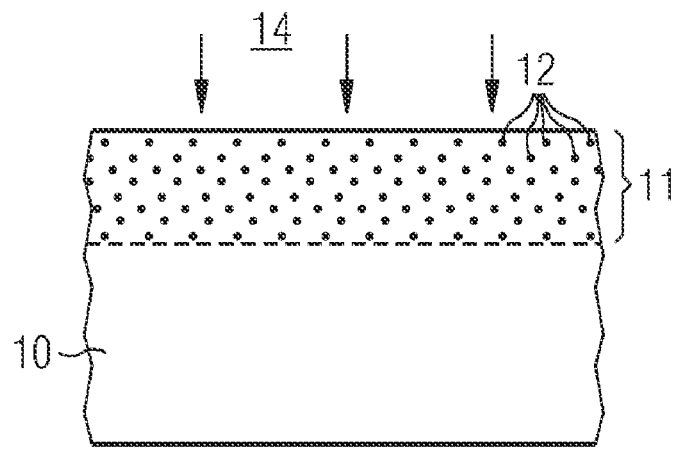
FIGS. 1a to 1c illustrate in schematic cross-sectional views selected method processes of one embodiment of a method including producing a monocrystalline layer on a substrate.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Exemplary embodiments are explained in more detail below with reference to the accompanying Figures.

However, the invention is not restricted to the embodiments specifically described, but rather can be modified and altered in a suitable manner. It lies within the scope of the invention to suitably combine individual features and feature combinations of one embodiment with features and feature combinations of another embodiment in order to obtain further embodiments according to the invention.

Before the exemplary embodiments of the present invention are explained in more detail below with reference to the Figures, it is pointed out that identical elements in the Figures are provided with the same or similar reference symbols and that a repeated description of these elements is omitted. Furthermore, the Figures are not necessarily true to scale; rather, the main emphasis is on elucidating the basic principle.

One embodiment provides a method by which a monocrystalline layer can be produced as far as possible without any defects on a monocrystalline substrate having a different lattice constant.

One embodiment describes a method for producing a monocrystalline layer having a first lattice constant on a monocrystalline substrate having a second lattice constant at least in a near-surface region, the second lattice constant being different from the first lattice constant, wherein lattice matching atoms are implanted at least in the near-surface region, the near-surface region is momentarily melted, and the layer is epitaxially deposited on the near-surface region that has solidified in monocrystalline fashion.

By using the lattice matching atoms, the lattice constant of the substrate can be matched to the lattice constant of the layer to be deposited thereon. Consequently, during the epitaxial deposition of the layer on the substrate treated in this way, at least significantly fewer defects are produced in the layer.

FIG. 1a illustrates a selected method process for producing a monocrystalline layer on a monocrystalline substrate. In this embodiment, lattice matching atoms 12 are implanted into a monocrystalline substrate 10 in a near-surface region 11. This implantation process is illustrated with the aid of arrows 14 in FIG. 1a. Suitable implantation doses of the lattice matching atoms 12 lie for example in the range of $1 \times 10^{15}$ cm$^{-2}$ to $1 \times 10^{16}$ cm$^{-2}$. The substrate 10 has a specific lattice constant b before the implantation at least in the near-surface region 11. The substrate 10 can be for example a semiconductor substrate produced from semiconductor material. All known semiconductors such as, for example, germanium, indium phosphide, silicon carbide, gallium arsenide and in one embodiment silicon are appropriate as the semiconductor material.

Figure 1B:
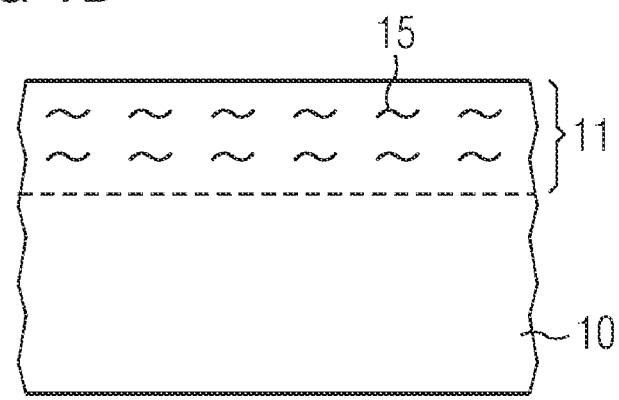

After the implantation 14 of lattice matching atoms 12 into the near-surface region 11, the near-surface region 11 is momentarily melted. In this embodiment, the melting is indicated with the aid of wavy lines 15 in FIG. 1b. The melting 15 can be effected for example by using laser irradiation, in one embodiment by using a pulsed laser irradiation. Depending on the wavelength, laser energy and possibly the number of pulses of the laser irradiation, typically a layer having a depth of 0.3 μm to 1 μm is melted at the surface of the substrate 10. During the recrystallization of the melted near-surface region 11, the lattice matching atoms 12 are incorporated for example into the crystal lattice of the near-surface region 11 at regular lattice sites, which leads to a distortion of the original crystal lattice and thus to a reduction or increase in the lattice constant b, depending on which type of lattice matching atoms is used. In this embodiment, the lattice matching atoms 12 are chosen with respect to the lattice constant a of the layer 13 to be deposited on the near-surface region 11. Such a layer 13 produced on the near-surface region 11 that has solidified in monocrystalline fashion is illustrated schematically in FIG. 1c. The layer 13 can be produced for example with a semiconductor material, in one embodiment silicon. If the lattice constant a of the layer 13 is greater than the lattice constant b of the substrate 10 or at least of the near-surface region 11 of the substrate 10, then lattice matching atoms 12 that increase this original lattice constant b are chosen. If the lattice constant a of the layer 13 is less than the lattice constant b of the substrate 10 or at least of the near-surface region 11, then lattice matching atoms 12 that decrease this original lattice constant b are chosen. What can also have an advantageous effect in the case of the variants described above is that possible crystal defects that arise in the substrate 10 can be detained by the distortion of the lattice on account of the lattice matching atoms.

Figure 1C:
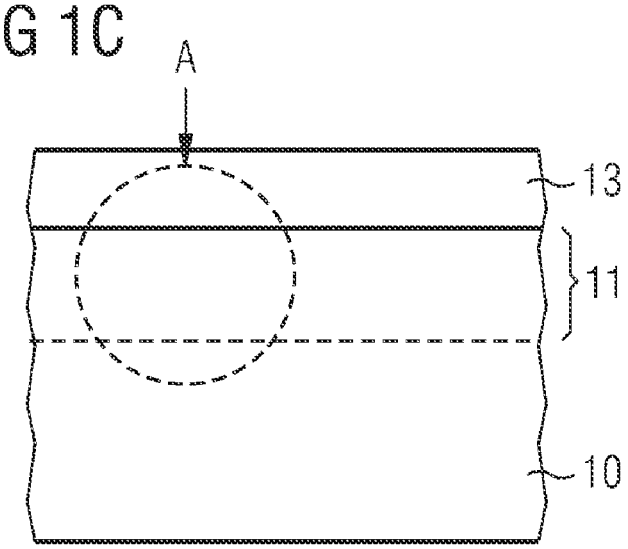
Figure 2:
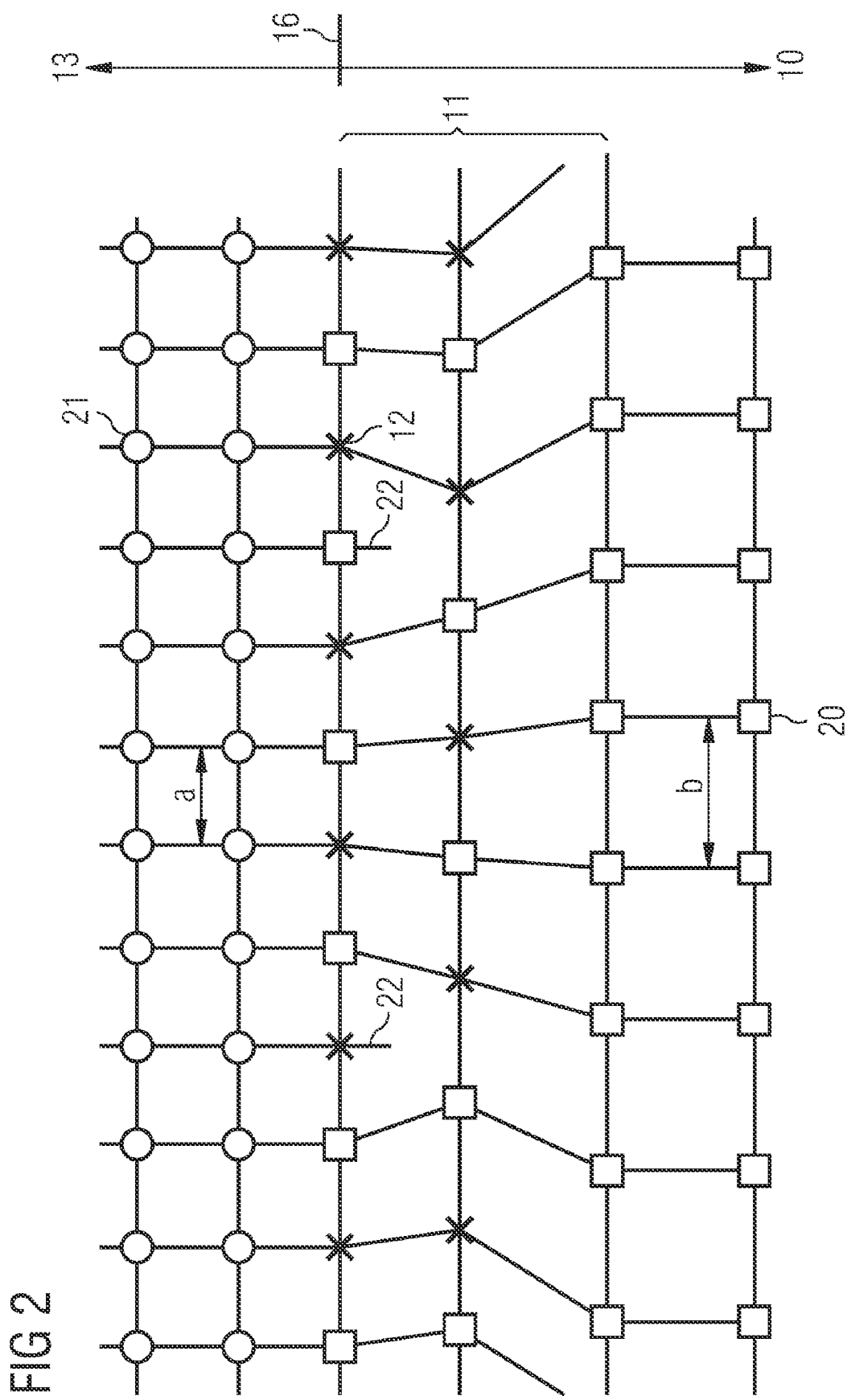
FIG. 2 schematically illustrates an excerpt from a crystal lattice at the transition from a substrate to a monocrystalline layer in accordance with one embodiment.

FIG. 2 illustrates a greatly enlarged excerpt A from FIG. 1c. In this embodiment, FIG. 2 schematically illustrates an atomic lattice at the transition from the substrate 10 to the layer 13. In this embodiment, the substrate 10 has an atomic lattice having a lattice constant b. The substrate 10 is composed e.g., of a material of a first atomic type. The atoms 20, represented as squares in FIG. 2, of the substrate 10 are arranged at regular lattice sites in the schematic lattice. In the near-surface region 11 of the substrate 10, lattice matching atoms 12, represented as crosses in FIG. 2, are incorporated into the lattice at regular lattice sites. In this embodiment, the lattice matching atoms 12 cause a distortion of the original lattice of the substrate 10 in the form that the original lattice constant b of the substrate 10 is decreased in the near-surface region 11 provided with lattice matching atoms 12. As a result of the distortion of the original lattice of the substrate 10 in the near-surface region 11 provided with lattice matching atoms 12, dislocations 22 can also occur in the crystal lattice of the substrate 10. As a result, the surface 16 of the substrate 10 has at least approximately a lattice having a lattice constant a. The layer 13 produced on the surface 16 of the substrate 10 with atoms 21, represented as circles in FIG. 2, likewise has the lattice constant a. As a result of the matching of the lattice constant b of the substrate 10 to the lattice constant a of the layer 13 with the aid of the lattice matching atoms 12, epitaxial growth of the layer 13 on the surface 16 of the substrate 10 is possible without any defects or at least with fewer defects than if no lattice matching had taken place between the substrate 10 and the layer 13.

Figure 3:
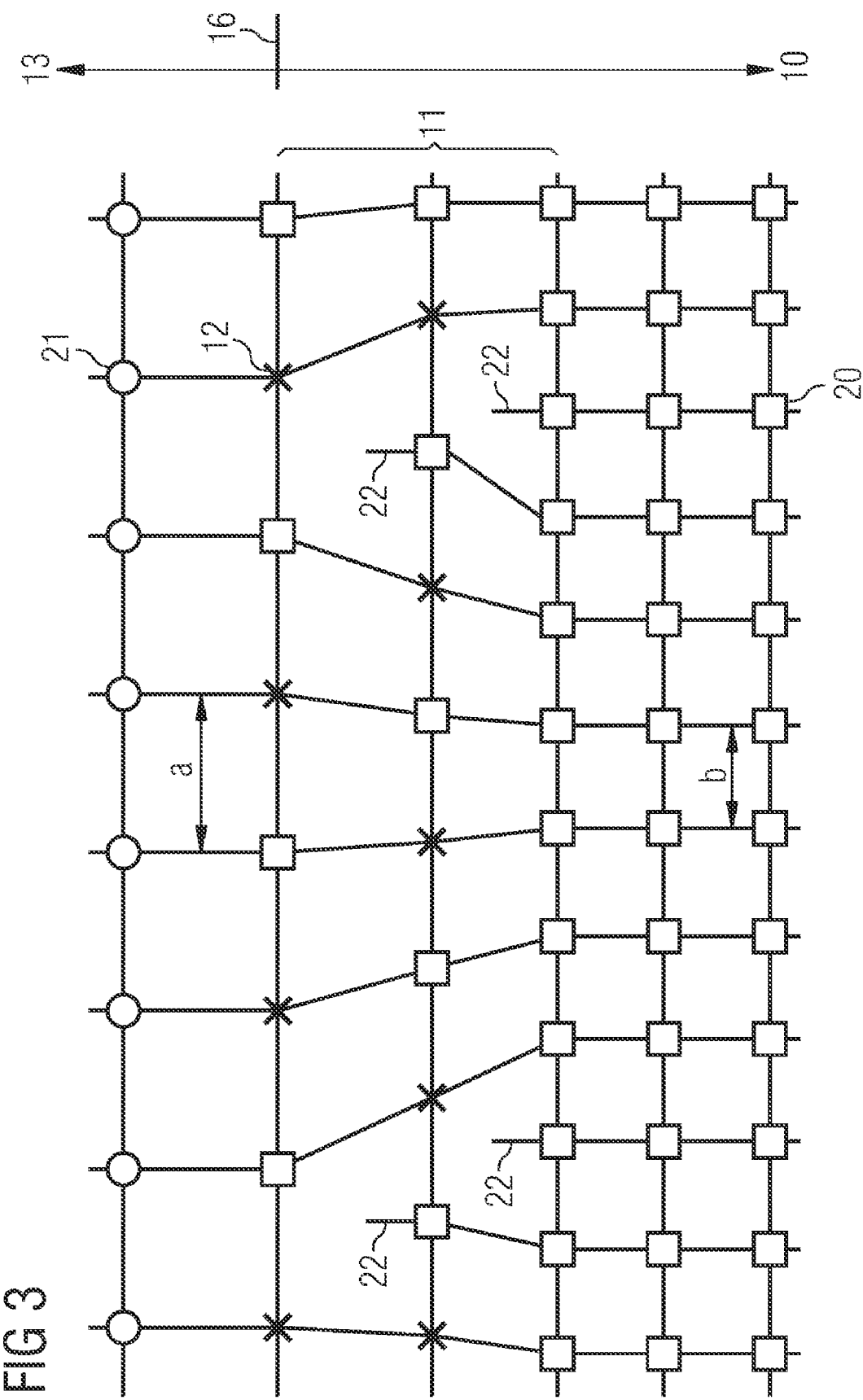
FIG. 3 schematically illustrates an excerpt from a crystal lattice at the transition from a substrate to a monocrystalline layer in accordance with one embodiment.

FIG. 3 illustrates the greatly enlarged excerpt A from FIG. 1c of another embodiment. This embodiment differs from the embodiment illustrated in FIG. 2 in that the lattice constant b of the substrate 10 is less than the lattice constant a of the layer 13 produced on the substrate 10. In this case, the lattice matching atoms 12 distort the lattice of the substrate 10 in the near-surface region 11 in the form that the original lattice constant b of the substrate 10 is increased in the near-surface region 11. As a result, the surface 16 of the substrate 10 likewise has at least approximately the lattice constant a. Therefore, as already explained with regard to FIG. 2, an epitaxial deposition of the layer 13 is possible at least with a lower defect density than in the case of no lattice matching.

Figure 4:
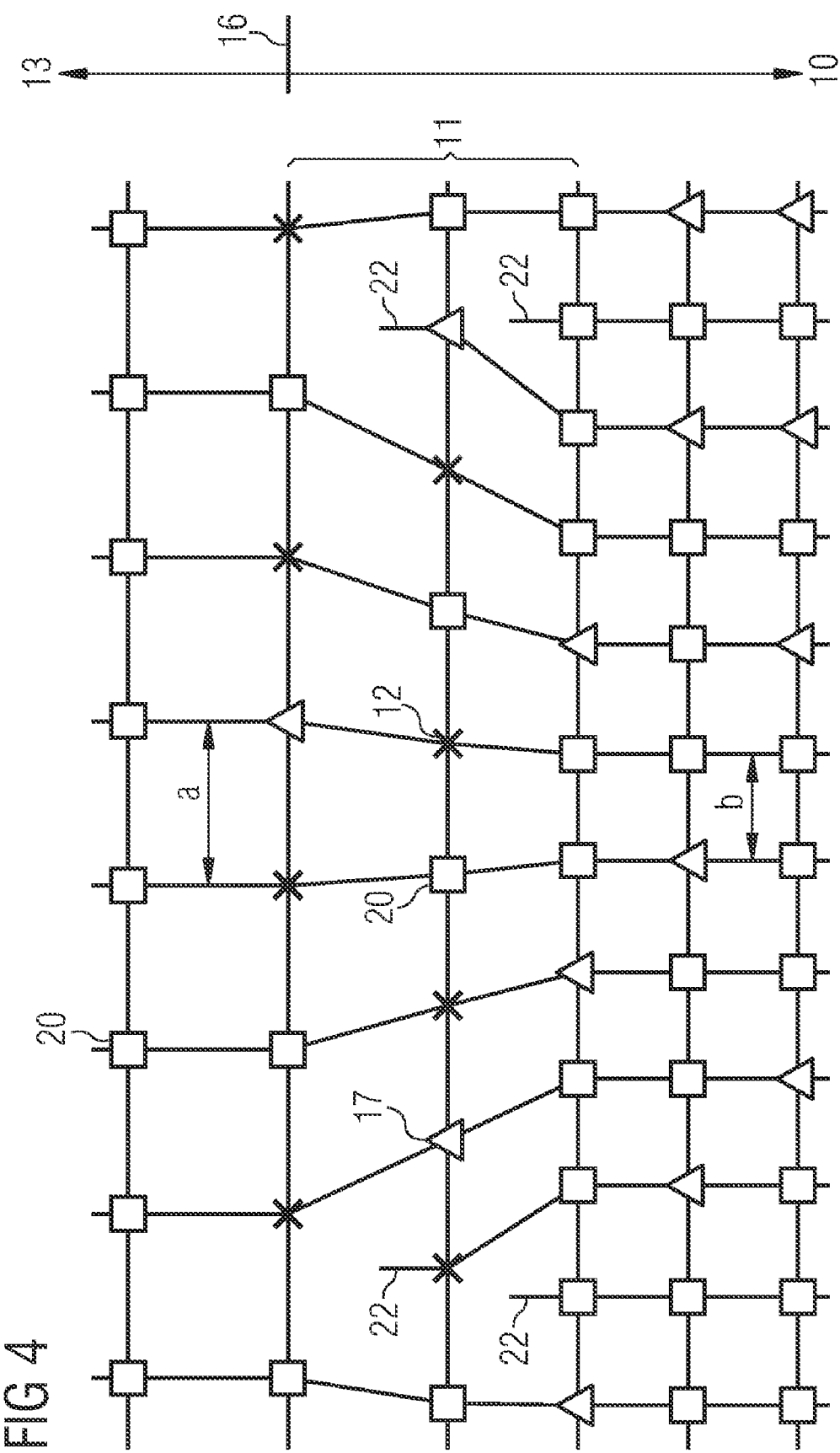
FIG. 4 schematically illustrates an excerpt from a crystal lattice at the transition from a substrate to a monocrystalline layer in accordance with one embodiment.

FIG. 4 illustrates the enlarged excerpt A from FIG. 1c in a further embodiment. In this embodiment, the substrate 10 also includes in its original composition alongside the atoms 20, represented as squares in FIG. 4, in addition a further impurity 17, represented as triangles in FIG. 4. A silicon substrate having a dopant such as, for example, phosphorus as impurity 17 shall be mentioned here by way of example. The lattice of the substrate 10 composed of the atoms 20 and the impurity 17 has a lattice constant b. This lattice constant b differs from the lattice constant of a lattice which is constructed only from atoms 20, for example. The lattice constant b is significantly altered particularly at high concentrations of the impurity 17. One or more embodiments provide for example impurity concentrations of at least $5 \times 10^{19}$ cm$^{-3}$, in one embodiment even more than $1 \times 10^{20}$ cm$^{-3}$, in the substrate. In the embodiment illustrated in FIG. 4, a layer 13 composed only of atoms 20, for example, is produced on the surface 16 of the substrate 10. In this embodiment, the lattice of the layer 13 has a lattice constant a that is greater than the lattice constant b of the substrate 10 composed of atoms 20 and the impurity 17.

In order to match the lattice constant b of the substrate 10 altered by the impurity 17 to the lattice constant a of the layer 13 composed only of atoms 20, lattice matching atoms 12 are therefore at least incorporated again in the near-surface region 11 of the substrate 10. As a result of this incorporation of the lattice matching atoms 12, the alteration of the lattice constant b of the substrate caused by the impurity 17 is compensated for and the lattice constant of the near-surface region 11 of the substrate 10 is matched to the lattice constant a of the layer 13. In the above-described case of a silicon substrate with phosphorus doping as impurity 17, germanium, for example, is appropriate as lattice matching atom 12. In this embodiment, suitable concentration ratios Ge:P of germanium atoms to phosphorus atoms can lie in the range of between 0.5 and 2, in one embodiment between 1 and 1.5, in order to achieve a sufficient matching of the lattice constant b to a silicon layer 13 produced on such a substrate 10.

One embodiment provides for a non-melting thermal process to be carried out at the substrate 10 after the melting 15 of the near-surface region 11. Such a non-melting thermal process can be for example an RTA (rapid thermal annealing) or a conventional high-temperature process which leads to a greater expansion of the near-surface region 11 provided with lattice matching atoms 12 into the substrate 10. This diffusion process can result in a gradient in the concentration profile of the lattice matching atoms 12 in the depth of the substrate 10. As a result, it is possible to produce a continuous transition between the momentarily melted near-surface region 11 provided with lattice matching atoms 12 and the region of the substrate 10 that is not provided with lattice matching atoms 12. This fosters the avoidance or at least a further reduction of stresses in the epitaxially deposited layer 13. In a further embodiment, the implantation dose of the lattice matching atoms 12 can be correspondingly matched to the increased penetration depth of the lattice matching atoms 12, such that in the given case of an additional impurity 17 in the substrate 10, it is possible to comply with a targeted ratio of impurity 17 to lattice matching atoms 12 at least in the near-surface region.

In one embodiment, the non-melting thermal process takes place after the epitaxial deposition of the layer 13. As a result, the lattice matching atoms 12 can also be indiffused into the layer 13.

Another embodiment provides for the non-melting thermal process already to take place before the epitaxial deposition of the layer 13. For this purpose, before the thermal process, a barrier layer (not illustrated) can be produced on the near-surface region 11 in order as far possible to avoid outdiffusion of the lattice matching atoms 12 from the near-surface region 11. An oxide layer, for example, is appropriate as the barrier layer. The barrier layer is removed again after the thermal process.

A further embodiment provides for the implantation 14 of the lattice matching atoms 12, the momentary melting 15 of the near-surface region 11 and the epitaxial deposition of the layer 13 on the near-surface region 11 that has solidified in monocrystalline fashion to be repeated once or a number of times. It is thereby possible to produce a wider transition region with lattice matching atoms 12 with corresponding lattice distortions between the crystal lattice having the lattice constant a and the crystal lattice having the lattice constant b.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method comprising:
providing a monocrystalline substrate; and
producing a monocrystalline layer having a first lattice constant a on the monocrystalline substrate having a second lattice constant b at least in a near-surface region, the second lattice constant being different from the first lattice constant a, comprising:
implanting lattice matching atoms at least in the near-surface region;
momentary melting of the near-surface region; and
epitaxial deposition of the layer on the near-surface region that has solidified in monocrystalline fashion,
wherein the substrate has an impurity, and
wherein the impurity is contained with a concentration of at least $5 \times 10^{19}$ cm$^{-3}$ in the substrate.

2. The method of claim 1, comprising producing the substrate with a semiconductor material.

3. The method of claim 2, wherein the semiconductor material is silicon.

4. The method of claim 1, wherein the concentration of the impurity is higher than $1 \times 10^{20}$ cm$^{-3}$.

5. A method comprising:
providing a monocrystalline substrate; and
producing a monocrystalline layer having a first lattice constant a on the monocrystalline substrate having a second lattice constant b at least in a near-surface region, the second lattice constant being different from the first lattice constant a, comprising:
implanting lattice matching atoms at least in the near-surface region;
momentary melting of the near-surface region; and
epitaxial deposition of the layer on the near-surface region that has solidified in monocrystalline fashion.
wherein the substrate has an impurity, and
wherein the impurity is phosphorus.

6. The method of claim 5, wherein the lattice matching atoms are germanium atoms.

7. The method of claim 6, wherein a ratio Ge:P of the concentrations between germanium and phosphorus lies in a range of between 0.5 and 2.

8. The method of claim 7, wherein the ratio Ge:P lies between 1 and 1.5.

9. The method of claim 5, comprising producing the substrate with a semiconductor material.

10. The method of claim 9, wherein the semiconductor material is silicon.

11. A method comprising:
providing a monocrystalline substrate; and
producing a monocrystalline layer having a first lattice constant a on the monocrystalline substrate having a second lattice constant b at least in a near-surface region, the second lattice constant being different from the first lattice constant a, comprising:
implanting lattice matching atoms at least in the near-surface region;
momentary melting of the near-surface region; and
epitaxial deposition of the layer on the near-surface region that has solidified in monocrystalline fashion,
wherein the lattice matching atoms, at least in the near-surface region, match the second lattice constant b to the first lattice constant a by the lattice matching atoms being incorporated into the crystal lattice of the near-surface region.

12. The method of claim 11, wherein the lattice matching atoms increase the second lattice constant b if the first lattice constant a is greater than the second lattice constant b before the incorporation of the lattice matching atoms.

13. The method of claim 11, wherein the lattice matching atoms decrease the second lattice constant b if the first lattice constant a is less than the second lattice constant b before the incorporation of the lattice matching atoms.

14. The method of claim 11, comprising effecting the momentary melting by irradiating the near-surface region using a laser.

15. The method of claim 11, comprising melting the near-surface region to a depth of between 0.3 µm and 1 µm.

16. The method of claim 11, wherein the implantation dose of the lattice matching atoms is in the range of $1 \times 10^{15}$ cm$^{-2}$ to $1 \times 10^{16}$ cm$^{-2}$.

17. The method of claim 11, comprising performing, after the melting of the near-surface region, a non-melting thermal process at the substrate.

18. The method of claim 17, wherein the non-melting thermal process takes place before the epitaxial deposition of the layer.

19. The method of claim 17, wherein the non-melting thermal process takes place after the epitaxial deposition of the layer.

20. The method of claim 18, comprising producing, before the non-melting thermal process, a barrier layer on the near-surface region.

21. The method of claim 20, wherein the barrier layer is an oxide layer.

22. The method of claim 20, comprising again removing the barrier layer after the non-melting thermal process.

23. A method of making a semiconductor comprising:
providing a monocrystalline substrate made of a semiconductor material; and
producing a monocrystalline layer having a first lattice constant a on the monocrystalline substrate having a second lattice constant b at least in a near-surface region, the second lattice constant being different from the first lattice constant a comprising:
implanting lattice matching atoms at least in the near-surface region;
momentary melting of the near-surface region; and
epitaxial deposition of the layer on the near-surface region that has solidified in monocrystalline fashion.

24. The method of claim 23, wherein the semiconductor material is silicon.

25. The method of claim 23, comprising repeating the implantation of lattice matching atoms, the momentary melting and the epitaxial deposition of the layer once or a number of times.

* * * * *

UNITED STATES PATENT AND TRADEMARK OFFICE
CERTIFICATE OF CORRECTION

PATENT NO.        : 8,263,483 B2
APPLICATION NO.   : 12/498418
DATED             : July 7, 2009
INVENTOR(S)       : Franz Hirler et al.

Page 1 of 1

It is certified that error appears in the above-identified patent and that said Letters Patent is hereby corrected as shown below:

On the Title Page

Item (63), please add the following:

--Foreign Application Priority Data
July 8, 2008    (DE)         10 2008 032 171.0--

Signed and Sealed this
Twenty-fourth Day of June, 2014

Michelle K. Lee
*Deputy Director of the United States Patent and Trademark Office*